United States Patent [19]

Fiordalice et al.

[11] Patent Number: 5,801,098
[45] Date of Patent: Sep. 1, 1998

[54] METHOD OF DECREASING RESISTIVITY IN AN ELECTRICALLY CONDUCTIVE LAYER

[75] Inventors: Robert Fiordalice; Sam Garcia; T. P. Ong, all of Austin, Tex.

[73] Assignee: Motorola, Inc., Schaumburg, Ill.

[21] Appl. No.: 708,245

[22] Filed: Sep. 3, 1996

[51] Int. Cl.$^6$ ............................................. H01L 21/441
[52] U.S. Cl. ...................... 438/653; 438/660; 438/685; 438/688
[58] Field of Search ........................... 437/190, 192, 437/245, 246; 438/653, 660, 685, 648, 656, 669, 688

[56] References Cited

U.S. PATENT DOCUMENTS

| | | | |
|---|---|---|---|
| 4,701,349 | 10/1987 | Koyanagi et al. | 427/228 |
| 4,822,753 | 4/1989 | Pintchovski et al. | 437/192 |
| 5,084,412 | 1/1992 | Nakasaki | 437/189 |
| 5,196,360 | 3/1993 | Doan et al. | 437/41 |
| 5,232,871 | 8/1993 | Ho | 437/190 |
| 5,296,404 | 3/1994 | Akahori et al. | 437/173 |
| 5,300,455 | 4/1994 | Vuillermoz et al. | 437/190 |
| 5,449,631 | 9/1995 | Giewont et al. | 437/41 |
| 5,508,066 | 4/1996 | Akahori | 427/571 |
| 5,567,483 | 10/1996 | Foster et al. | 427/535 |
| 5,587,339 | 12/1996 | Wyborn et al. | |

FOREIGN PATENT DOCUMENTS

0711846 A1  10/1995  European Pat. Off.  ........ H01L 21/00

OTHER PUBLICATIONS

Rossnagel; "Directional Sputter Deposition for Semiconductor Applications"; Mat. Res. Soc. Symp. Proc., vol. 354; pp. 503–510 (1996).

Rossnagel, et al.; "Magnetron sputter deposition with high levels of metal ionization", Appl. Phys. Lett. 63 (24); pp. 3285–3287 (1993).

*Primary Examiner*—Caridad Everhart
*Attorney, Agent, or Firm*—Jeffrey S. Abel; Patricia S. Goddard

[57] ABSTRACT

A method of decreasing resistivity in an electrically conductive layer (23) includes providing a substrate (14), using a high density plasma sputtering technique to deposit the electrically conductive layer (23) over the substrate (14), and exposing the electrically conductive layer (23) to an anneal in an ambient comprised of a plasma (21).

20 Claims, 2 Drawing Sheets

METHOD OF DECREASING RESISTIVITY IN AN ELECTRICALLY CONDUCTIVE LAYER

BACKGROUND OF THE INVENTION

This invention relates, in general, to semiconductors, and more particularly, to methods of decreasing the resistivity of electrically conductive layers in semiconductor components.

Multi-level metal (MLM) systems in semiconductor components include dielectric layers that often have vias with high aspect ratios. Conventionally, metal films are sputtered over the dielectric layers and into the vias. An example of a conventional sputter deposition technique is reactive ion sputtering (RIS). However, RIS metal layers have poor step coverage, fail to sufficiently cover the bottom surfaces of the vias, and produce voids in the vias because of the high aspect ratios of the vias.

Other techniques used to deposit metal layers include collimated depositions and chemical vapor depositions (CVD). However, the deposition rates for collimated metal films are too slow for manufacturing applications, and the defectivity of collimated metal films is very high compared to conventionally sputtered films. Furthermore, the resistivity of CVD metal films is very high compared to conventionally sputtered films, and CVD metal films also have very high contamination levels compared to conventionally sputtered films.

Another metal deposition technique is known in the art as high density plasma (HDP) sputtering, which includes, but is not limited to, inductively coupled plasma (ICP) sputtering and electron cyclotron resonance (ECR) sputtering. HDP metal films have fewer problems than the other types of metal films previously mentioned. For example, HDP metal films have little contamination, have high deposition rates that are suitable for manufacturing applications, and have better step coverage than conventionally sputtered and collimated films. However, the resistivity of HDP metal films is higher than the resistivity of conventionally sputtered films.

Accordingly, a need exists for a method of decreasing the resistivity in an electrically conductive layer that is deposited using a high density plasma sputtering technique. The method should be manufacturable, should not significantly increase the cycle time for manufacturing a semiconductor device, and should be cost-effective. The method should also be compatible with dielectric materials having low dielectric constants.

DETAILED DESCRIPTION OF THE DRAWINGS

Figure 1:
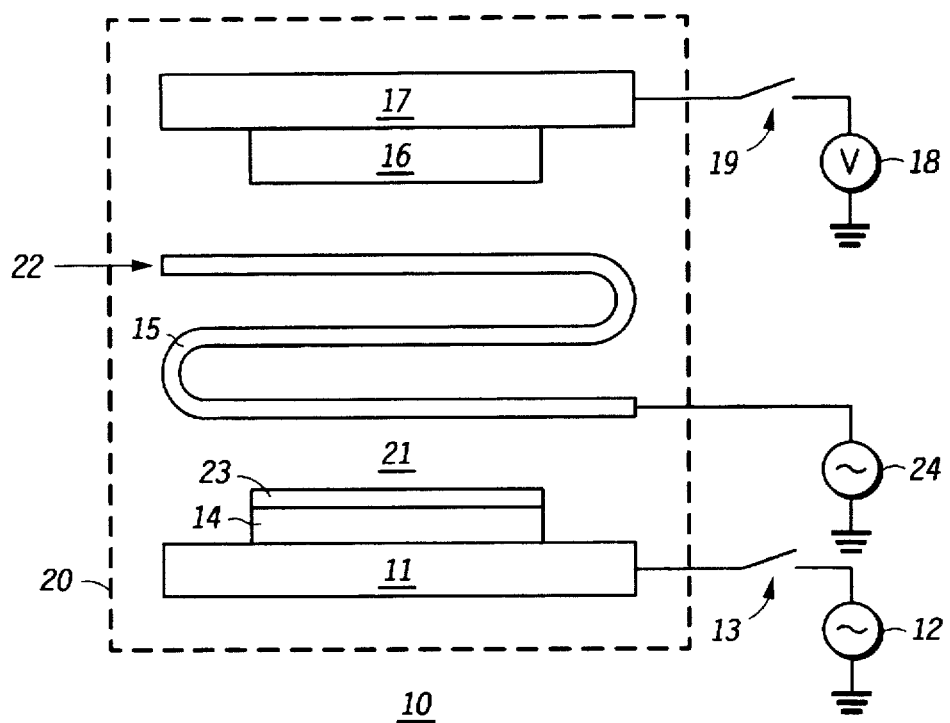
FIG. 1 illustrates a schematic view of a high density plasma sputtering system in accordance with the present invention.

FIG. 1 illustrates a schematic view of a high density plasma (HDP) sputtering system 10 for manufacturing or fabricating a semiconductor component. As understood in the industry, high denisty plasma generally refers to plasma densities on the order of $10^9$ ions per cubic centimeter (ions/cm$^3$) or higher. In embodiments of the present invention, a plasma on the order of $10^{11}$ ions/cm$^3$ or higher is preferred. Different types of HDP sputtering systems include, but are not limited to, inductively coupled (ICP) sputtering systems and electron cyclotron resonance (ECR) sputtering systems. Although the following description of system 10 is in reference to an ICP sputtering system, it is understood that the method of operating system 10 can be applied to other types of HDP sputtering systems, including ECR sputtering systems. The components of system 10 are known in the art and, therefore, will only be briefly described hereinafter.

System 10 includes a chamber 20 that has a susceptor 11 for supporting a workpiece or substrate 14. Susceptor 11 serves as an anode within chamber 20 and is electrically coupled to a voltage source 12 through a switch 13. Source 12 is preferably an alternating current (a.c.) or radio frequency (r.f.) source so that system 10 can be used to deposit electrically conductive materials and electrically insulative materials. When switch 13 is closed, source 12 induces a direct current (d.c.) bias of approximately zero to negative three hundred volts on susceptor 11 and substrate 14.

Chamber 20 also includes a cathode 17 that is located over susceptor 11 and substrate 14. As an example, cathode 17 can be a d.c. magnetron cathode, as known in the art, wherein cathode 17 supports a metal sputtering target 16 that faces towards substrate 14. Cathode 17 is electrically coupled to a voltage source 18 through a switch 19. When switch 19 is closed, source 18 electrically biases cathode 17 and target 16 with a positive voltage to attract sputtering ions (not shown) that sputter ions off of target 16 down towards substrate 14 below.

Chamber 20 further includes an r.f. coil 15 that is located between cathode 17 and susceptor 11. Coil 15 is electrically coupled to an a.c. source 24. Coil 15 facilitates the generation of an inductively coupled plasma 21 located between target 16 and substrate 14. Plasma 21 can be created around coil 15 by injecting a gas 22 into chamber 20 and by applying less than approximately two megahertz of power from a source 24 to coil 15. In an alternative embodiment, source 24 provides less than approximately fourteen megahertz of power to coil 15 to generate plasma 21.

An electrically conductive layer 23 is deposited over substrate 14 within chamber 20 using the following HDP sputtering technique. Switches 13 and 19 are closed during the deposition of layer 23 such that sources 12 and 18 are electrically coupled to susceptor 11 and cathode 17, respectively. Chamber 20 is brought to a gas pressure of approximately ten to fifty milliTorr, and susceptor 11 and substrate 14 are heated to a temperature of greater than approximately one hundred degrees Celsius and less than approximately four hundred degrees Celsius. Plasma 21 is generated within chamber 20 as described hereinbefore, and electrically neutral metal atoms are sputtered off of target 16 in a direction towards substrate 14 as also described hereinbefore. This sputtering process can be accomplished by using a technique similar to that used for conventional reactive sputtering or magnetron sputtering. A portion of the electrically neutral atoms that are sputtered off of target 16 pass through plasma 21 unchanged and are deposited over substrate 14 to form a portion of layer 23. The remaining portion of the electrically neutral atoms become electrically ionized atoms while passing through plasma 21. The electrical bias applied to substrate 14 attracts the ionized atoms towards substrate 14 and improves the step coverage of layer 23, which is comprised of both ionized and non-ionized metal atoms. The ionization of the metal atoms and the electrical bias on substrate 14 provides the improved step coverage of layer 23 compared to conventional reactive sputtering techniques.

However, the as-deposited resistivity of layer 23 is approximately two to three times higher than the as-deposited resistivity of a conventionally reactively sputtered metal layer. Therefore, to reduce or decrease the as-deposited resistivity of layer 23, layer 23 is exposed to an in-situ plasma anneal within chamber 20 for a time of greater than approximately twenty seconds but less than approximately one hundred twenty seconds so that the cycle time for manufacturing a semiconductor component is not significantly increased. Plasma 21, which was used during the deposition of layer 23, can also be used during the post-deposition in-situ plasma anneal for layer 23. Therefore, the gas flow of gas 22 into chamber 20 that was used during the deposition of layer 23 can be continued during the annealing of layer 23 to maintain plasma 21. Similarly, the temperature range and the pressure range used during the deposition of layer 23 can also be kept and used during the anneal of layer 23 so that the cycle time for manufacturing a semiconductor component is not significantly increased. Thus, to increase the manufacturing throughput, layer 23 is preferably not exposed to ambient air between the deposition of layer 23 and the plasma annealing of layer 23, and layer 23 is preferably exposed to ambient air only after annealing layer 23. In an alternative embodiment, the plasma used during the post-deposition in-situ plasma anneal can be different from the plasma used during the deposition of layer 23 and can be comprised of nitrogen, ammonia, or any noble gas. The annealing plasma is preferably not comprised of oxygen or other elements that can chemically react with layer 23 and increase the resistivity of layer 23.

During the in-situ plasma anneal for layer 23, switches 13 and 19 are open such that substrate 14 and target 16 are electrically unbiased. Thus, with switches 13 and 19 open, an electrically biased voltage is kept off of substrate 14 and target 16, and layer 23 will not be substantially bombarded with ions or other particles in order to prevent the incorporation of additional ions within layer 23, to prevent damaging layer 23, and to maintain the preferred as-deposited stoichiometry for layer 23. Using the aforementioned plasma anneal, experiments have shown a forty percent and higher reduction in the as-deposited resistivity of layer 23 that was deposited using a HDP sputtering technique.

In the preferred embodiment, layer 23 is comprised of a stoichiometric layer of titanium nitride to maximize the effectiveness of layer 23 as a barrier layer and as an adhesive layer in a multi-level interconnect or multi-level metal (MLM) system for a semiconductor component. Accordingly, target 16 is preferably comprised of titanium or titanium nitride and gas 22 is preferably comprised of nitrogen to form a nitrogen plasma for plasma 21. This preferred embodiment is described in more detail hereinafter with reference to FIGS. 2 and 3. Alternative embodiments for layer 23 include, but are not limited to, titanium silicon nitride, tungsten nitride, tungsten silicon nitride, tantalum nitride, tantalum silicon-nitride, or the like.

Figure 2:
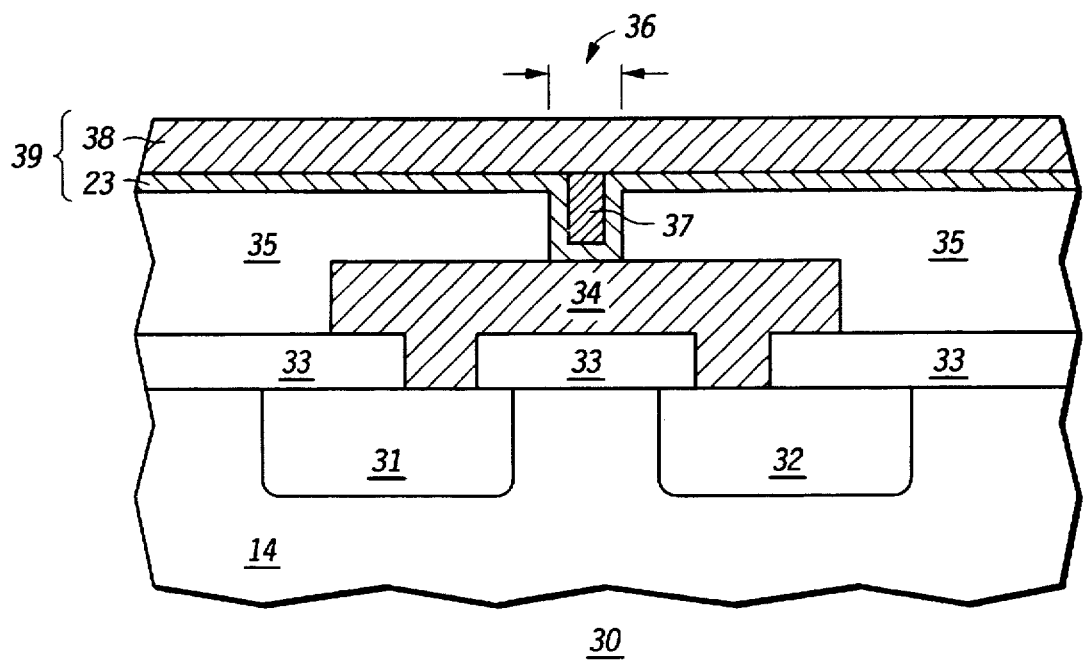
FIG. 2 portrays a partial cross-sectional view of an embodiment of a semiconductor component in accordance with the present invention.

FIG. 2 portrays a partial cross-sectional view of a semiconductor component 30. It is understood that the same reference numerals are used in the figures to denote the same elements. Component 30 includes substrate 14, which can be comprised of a semiconductor material such as, for example, silicon or gallium arsenide. A plurality of semiconductor devices 31 and 32 are formed in substrate 14 using semiconductor processing techniques known to those skilled in the art. As an example, devices 31 and 32 can be a field effect transistor and a bipolar transistor, respectively. Because devices 31 and 32 can have many different structures, the depicted structures are only for the purpose of illustrating devices 31 and 32.

A dielectric layer or electrically insulative layer 33 is deposited over substrate 14 and over devices 31 and 32. Then, an electrically conductive layer or interconnect layer 34 is formed over layer 33 after patterning layer 33. As an example, layer 33 can be comprised of silicon oxide or silicon nitride, and layer 34 can be comprised of a metal such as, for example, aluminum, copper, tungsten, or titanium. Layer 34 is electrically coupled to devices 31 and 32 through the vias of layer 33. After etching or patterning layer 34, a dielectric or electrically insulative layer 35 is provided over layers 33 and 34. The composition of layer 35 can similar to that of layer 33, and the deposition and etching of layers 33, 34, and 35 are known to those skilled in the art of MLM systems. After etching a via in layer 35 to expose a portion of layer 34, layer 23 is deposited over layer 35 and is deposited in the via of layer 35 using the previously described HDP sputtering technique to provide an improved step coverage for layer 23 within the via of layer 35. Thus, layer 23 is electrically coupled to layer 34 through the via of layer 35. Subsequently, layer 23 is annealed in-situ to reduce the as-deposited resistivity of layer 23, as previously described. Then, an electrically conductive layer or metal layer 37 is deposited within the via of layer 35 and can be planarized using a chemical-mechanical polish or other planarizing technique. As an example, layer 37 can be comprised of tungsten, copper, or aluminum. Next, an electrically conductive layer 38 is deposited over layers 23 and 37 wherein layer 23 electrically couples layers 34 and 38 and wherein layers 23, 37, and 38 form a composite interconnect layer 39. In one embodiment, the composition of layer 38 can be similar to that of layer 34. In an alternative embodiment, layer 37 can be replaced with layer 38. Subsequently, layer 39 is etched or patterned with a single etch mask (not shown) wherein layer 23 is etched or patterned after layer 38.

As discussed previously, layer 23 is preferably comprised of titanium nitride to serve as a diffusion barrier for layers 37 and 38. In the preferred embodiment, layer 23 also serves as an adhesion layer between layers 35 and 37 when layer 35 is comprised of silicon oxide and when layer 37 is comprised of tungsten because tungsten does not substantially adhere to silicon oxide. Layer 38 can be deposited before the plasma annealing of layer 23, but the deposition of layer 38 and the patterning of layer 39 are preferably performed after the annealing of layer 23 such that layer 23 is directly exposed to the plasma ambient during the annealing step to more effectively reduce the individual resistivity of layer 23 and the composite resistivity of layer 39.

In an MLM system, an intralevel capacitance between two adjacent levels of metal reduces the speed of a semiconductor component. The intralevel capacitance is proportional to a dielectric constant of a dielectric layer between two adjacent interconnect layers. For example, in FIG. 2, the intralevel capacitance of component 30 is dependent upon the dielectric constant of layer 35 between layers 34 and 39. To reduce the intralevel capacitance and to increase the speed of component 30, layer 35 is preferably comprised of a low dielectric constant material, which is known in the art as a low "k" dielectric. Typically, low "k" dielectrics have dielectric constants of less than approximately 3.5. However, low "k" dielectrics are typically deformable above approximately four hundred degrees Celsius. Therefore, the temperature of the depositions of layer 39 and the temperature of the resistivity reducing in-situ anneal for layer 23 is preferably below approximately four hundred degrees Celsius to prevent the deformation of layer 35. The post-deposition anneals of the prior art that are performed in a non-plasma ambient require an anneal temperature greater than approximately four hundred degrees Celsius, which will deform and degrade the low "k" dielectrics. The use of a plasma ambient in the post-deposition anneal for layer 23 enables the use of a lower anneal temperature below approximately four hundred degrees Celsius and ensures compatibility with low "k" dielectrics.

Figure 3:
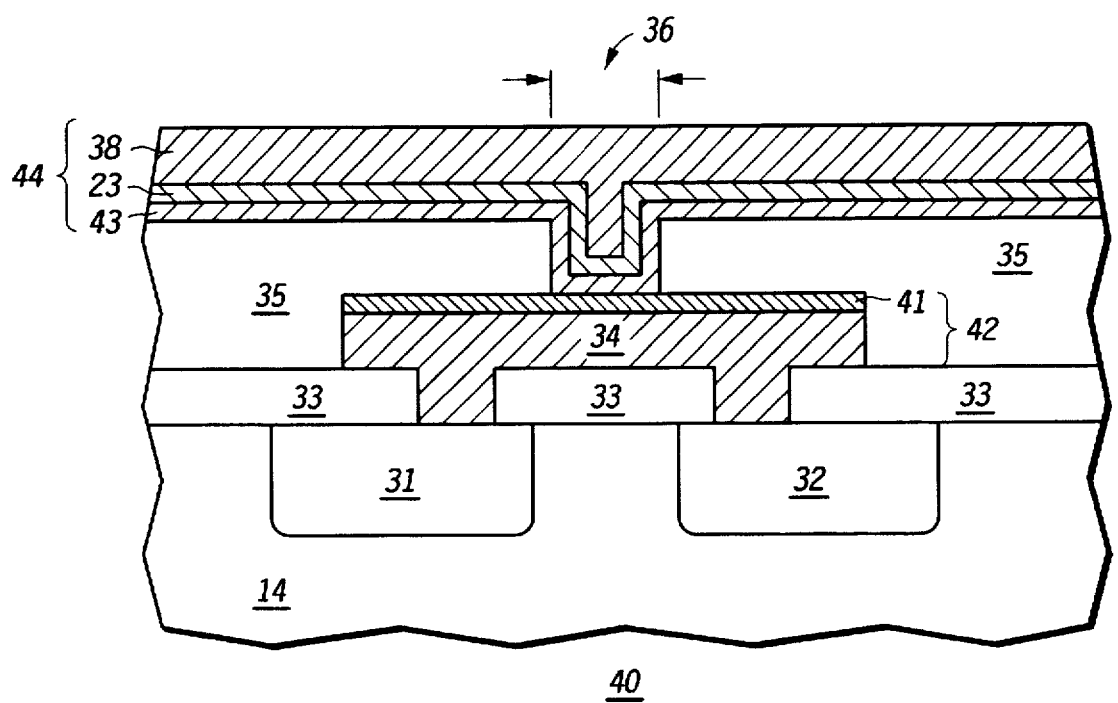
FIG. 3 depicts a partial cross-sectional view of an alternative embodiment of the semiconductor component of FIG. 2 in accordance with the present invention.

FIG. 3 depicts a partial cross-sectional view of a semiconductor component 40, which is an alternative embodiment of component 30 of FIG. 2. It is understood that the same reference numerals are used in the figures to denote the same elements. Component 40 includes an anti-reflective layer 41 between layers 34 and 35 wherein layer 41 can be comprised of a metal such as titanium nitride, titanium tungsten, or the like. Layers 34 and 41 form a composite interconnect layer 42. Another composite interconnect layer 44 is comprised of layers 23, 38, and 43. Electrically conductive layer 43 is located between layers 23 and 35. When layer 23 is comprised of titanium nitride, electrically conductive layer 43 can be comprised of titanium to further improve the adhesion of layer 44 to layer 35.

Therefore, it is apparent there has been provided an improved method of reducing the resistivity of an electrically conductive layer that overcomes the disadvantages of the prior art. The present method is manufacturable and is compatible with dielectric materials having low dielectric constants. Furthermore, the method described herein is cost-effective and does not significantly increase the cycle time for manufacturing a semiconductor component.

While the invention has been particularly shown and described with reference to preferred embodiments, it will be understood by those skilled in the art that changes in form and detail may be made without departing from the spirit and scope of the invention. For instance, the numerous details set forth herein such as, for example, the temperature, pressure, and voltage ranges are provided to facilitate the understanding of the present invention and are not provided to limit the scope of the invention. Additionally, the present method may be used to reduce the resistivity of electrically conductive films that are deposited using different techniques and that are comprised of different materials compared to those described herein. Accordingly, the disclosure of the present invention is not intended to be limiting. Instead, the disclosure of the present invention is intended to be illustrative of the scope of the invention, which is set forth in the following claims.

We claim:

1. A method of decreasing resistivity in an electrically conductive layer comprising:
   providing a substrate having an overlying metal member, the metal member comprising aluminum;
   using a high density plasma sputtering technique to deposit the electrically conductive layer over the substrate and in contact with the overlying metal member; and
   exposing the electrically conductive layer to a plasma at a temperature below approximately four hundred degrees Celsius to decrease resistivity of the electrically conductive layer.

2. The method of claim 1 wherein the step of exposing the electrically conductive layer includes keeping an electrically biased voltage off of the substrate.

3. The method of claim 1 wherein the step of using the high density plasma sputtering technique includes providing a stoichiometric layer of titanium nitride for the electrically conductive layer and wherein the step of exposing the electrically conductive layer includes maintaining a stoichiometry of the stoichiometric layer.

4. The method of claim 1 wherein the step of exposing the electrically conductive layer includes electrically biasing an r.f. coil at a frequency of less than approximately two megahertz to generate the plasma.

5. The method of claim 1 further comprising exposing the substrate to ambient air wherein the step of exposing the electrically conductive layer to the plasma occurs after the step of using the high density plasma sputtering technique and before the step of exposing the substrate to the ambient air.

6. The method of claim 1 wherein the step of using the high density plasma sputtering technique includes depositing the electrically conductive layer in a chamber and wherein the step of exposing the electrically conductive layer includes in-situ annealing the electrically conductive layer in the chamber.

7. The method of claim 1 wherein the step of exposing the electrically conductive layer includes selecting the plasma gas from the group consisting essentially of nitrogen, ammonia, or a noble gas.

8. A method of fabricating a semiconductor component comprising:
   providing a substrate having a metal interconnect, the interconnect comprising aluminum;
   using a high density plasma sputtering technique to deposit an electrically conductive layer over the substrate and in contact with the metal interconnect;
   reducing a resistivity of the electrically conductive layer by exposing the electrically conductive layer to a plasma without further deposition of the electrically conductive layer; and
   patterning the electrically conductive layer.

9. The method of claim 8 wherein the step of patterning the electrically conductive layer occurs before the step of reducing the resistivity of the electrically conductive layer and wherein the step of reducing the resistivity of the electrically conductive layer includes annealing the electrically conductive layer at a temperature below approximately four hundred degrees Celsius.

10. The method of claim 8 wherein the step of patterning the electrically conductive layer occurs after the step of reducing the resistivity of the electrically conductive layer and wherein the step of reducing the resistivity of the electrically conductive layer includes annealing the electrically conductive layer at a temperature below approximately four hundred degrees Celsius.

11. The method of claim 8 further comprising:
   providing a first dielectric layer between the substrate and the electrically conductive layer;
   providing a first metal layer between the first dielectric layer and the electrically conductive layer, wherein the first metal layer forms the metal interconnect;
   providing a second dielectric layer between the first metal layer and the electrically conductive layer;
   etching a via in the second dielectric layer to expose a portion of the metal interconnect wherein the step of depositing the electrically conductive layer includes depositing the electrically conductive layer into the via and electrically coupling the electrically conductive layer and the metal interconnect through the via;
   depositing a second metal layer over the electrically conductive layer and into the via wherein the electrically conductive layer adheres the second dielectric layer and the second metal layer and wherein the electrically conductive layer electrically couples the first and second metal layers; and patterning the second metal layer.

12. The method of claim 11 wherein the step of depositing the electrically conductive layer includes providing titanium nitride for the electrically conductive layer and wherein the step of depositing the second metal layer includes selecting the second metal layer from the group consisting essentially of tungsten, copper, or aluminum.

13. The method of claim 8 wherein the step of reducing the resistivity of the electrically conductive layer includes using an in-situ plasma anneal after the step of depositing the electrically conductive layer.

14. The method of claim 8 wherein the step of reducing the resistivity of the electrically conductive layer includes electrically unbiasing the substrate and exposing the electrically conductive layer to a plasma.

15. A method of manufacturing a semiconductor component comprising:

providing a semiconductor substrate;

forming a semiconductor device in the semiconductor substrate;

depositing a first dielectric layer over the semiconductor substrate;

depositing a metal layer over the first dielectric layer such that the metal layer is electrically coupled to the semiconductor device, the metal layer comprising aluminum;

depositing a second dielectric layer over the metal layer;

forming a via in the second dielectric layer to expose a portion of the metal layer;

using a high density plasma sputtering technique to deposit a titanium nitride layer over the second dielectric layer and into the via to make electrical contact to the portion of the metal layer, wherein the titanium nitride layer is deposited in a chamber using a high density plasma sputtering technique;

annealing the titanium nitride layer in a nitrogen plasma; and patterning the titanium nitride layer.

16. The method of claim 15 further comprising depositing an electrically conductive layer on the titanium nitride layer after the step of annealing the titanium nitride layer wherein the step of patterning the titanium nitride layer occurs after the step of annealing the titanium nitride layer.

17. The method of claim 15 wherein the step of annealing the titanium nitride layer includes annealing the titanium nitride layer for a time of less than approximately one hundred twenty seconds and at a temperature of approximately one hundred to four hundred degrees Celsius.

18. The method of claim 17 wherein the step of depositing the second dielectric layer includes providing the second dielectric layer with a dielectric constant less than approximately 3.5 and wherein the temperature of the annealing step is devoid of deforming the second dielectric layer.

19. The method of claim 15 wherein the step of depositing the titanium nitride layer includes providing a gas flow of nitrogen within the chamber and wherein the step of annealing the titanium nitride layer includes annealing the titanium nitride layer in the chamber and maintaining the gas flow of nitrogen within the chamber.

20. The method of claim 15 wherein the step of depositing the titanium nitride layer includes electrically biasing the semiconductor substrate and wherein the step of annealing the titanium nitride layer includes annealing the titanium nitride layer in the chamber and electrically unbiasing the semiconductor substrate.

* * * * *